(12) United States Patent
Kanada

(10) Patent No.: US 6,552,906 B2
(45) Date of Patent: Apr. 22, 2003

(54) RADIATOR FOR ELECTRONIC PARTS, ELECTRONIC DEVICE, ELECTRIC CIRCUIT DEVICE, AND COMPUTER

(75) Inventor: Yoshihisa Kanada, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/951,023

(22) Filed: Sep. 11, 2001

(65) Prior Publication Data

US 2002/0051342 A1 May 2, 2002

(30) Foreign Application Priority Data

Sep. 11, 2000 (JP) ........................................ 2000-275641

(51) Int. Cl.[7] ................................................ H05K 7/20
(52) U.S. Cl. ...................... 361/705; 174/16.3; 257/722; 165/80.3; 165/185; 361/710
(58) Field of Search ................................ 165/80.2, 80.3, 165/185, 104.33; 174/16.3, 252, 260; 257/706–707, 712–713, 718–719, 722; 361/687–690, 700, 704–710, 715, 717–721

(56) References Cited

U.S. PATENT DOCUMENTS

| | | | | |
|---|---|---|---|---|
| 5,410,449 A | * | 4/1995 | Brunner | 361/705 |
| 5,661,902 A | * | 9/1997 | Katchmar | 174/252 |
| 5,672,848 A | * | 9/1997 | Komoritar et al. | 174/260 |
| 5,796,582 A | * | 8/1998 | Katchmar | 361/704 |
| 6,016,006 A | * | 1/2000 | Kolman et al. | 361/705 |

* cited by examiner

Primary Examiner—Gregory Thompson

(57) ABSTRACT

To prevent generation of air bubbles in thermal grease 37 when a wired board 24 is bent due to a difference of thermal expansibility between a CPU chip 31 and a heat sink 32 in a CPU package 21, the thermal grease 37 being filled between the CPU chip 31 and a plate member 34 of the heat sink 32. A through-hole 38 is formed almost in the center of a plate member 34 so as to go through the plate member 34.

2 Claims, 7 Drawing Sheets

RADIATOR FOR ELECTRONIC PARTS, ELECTRONIC DEVICE, ELECTRIC CIRCUIT DEVICE, AND COMPUTER

BACKGROUND OF THE INVENTION

The present invention relates to a radiator for electronic parts, an electronic device, an electric circuit device, and a computer, more particularly to a radiator for electronic parts, an electronic device, an electric circuit device, and a computer in which generation of air bubbles is prevented in a heat conductive semifluid material.

FIG. 7(A), FIG. 7(B) and FIG. 7(C) collectively show how an air bubble 75 is generated in thermal grease 74 in a bending process of a wired board 72 employed in a conventional electronic device. A CPU chip 71 is mounted at a predetermined position on the wired board 72 and a heat sink 73 is mounted above the CPU chip 71. The heat sink 73 is larger in area than the CPU chip 71. The bottom of the heat sink 73 comes in contact with the top surface of the CPU chip 71. Even when the CPU chip 71 and the heat sink 73 are put in contact with each other directly, the actual contact area between the CPU chip 71 and the heat sink 73 is small. This is because the both items have the fine unevenness on their contact surfaces, and the CPU chip 71 is not so strong in structure, so that the heat sink 73 cannot be fixed onto the CPU chip 71 SO strongly by bolts (not illustrated) that fix the heat sink 73 to the wired board 72. The heat resistance thus becomes high in the heat conduction path from the CPU chip 71 to the heat sink 73. In addition, the heat density on the contact portion between the CPU chip 71 and the heat sink 73 becomes the highest in the heat conduction path between the CPU chip 71 and the heat sink 73 for the reasons of the thermal design. In order to solve this problem, therefore, the thermal grease 74 is provided between the top surface of the CPU chip 71 and the bottom surface of the heat sink 73, 50 that the air is purged from between both surfaces. The air, when it is left there, causes the heat resistance to be increased.

Recently, however, it has come to be known that a problem referred to as "pump out" occurs in such electronic devices. Concretely, because both ends of the heat sink 73 are fixed to predetermined portions of the wired board 72 via bolts and there appears a difference in the thermal expansibility between the wired board 72 and the heat sink 73, the bending degree of the wired board 72 is increased/decreased due to changes of the temperature of the subject electronic device, thereby the size of the space between the CPU chip 71 and the heat sink 73 is increased/decreased. FIGS. 7(A), (B), and (C) show how the state of the thermal grease 74 is changed according to the space size (standard, smaller than standard, and larger than standard) between the CPU chip 71 and the heat sink 73 in the center of the thermal grease 74. In FIG. 7(A), the thermal grease 74 is just fit in the top area of the CPU chip 71. In FIG. 7(B), the thermal grease 74 overflows the top area, because the space becomes thinner. In FIG. 7(C), a part of the thermal grease 74 that has overflowed in FIG. 7(B) does not return to the top area of the CPU chip 71 or delays to return, thereby an air bubble 75 is generated in the thermal grease 74. And, because the air bubble 75 causes a large heat resistance, generation of such an air bubble 75 in the thermal grease 74 must be prevented.

Published Unexamined Patent Application No.9-102567 discloses a technique for avoiding such air bubbles to be left between the surface of a base and solder when in soldering a heat sink to the base. According to the technique, a groove is formed on the surface of the base so as to purge the residual air smoothly and the groove surface is formed as a metallic one so as to embed the solder therein properly. However, the gazette does not describe any technique for suppressing generation of air bubbles in such a heat conductive semifluid material as thermal grease and the groove disclosed in the gazette cannot suppress generation of air bubbles in such the heat conductive semifluid material.

Under such circumstances, it is an object of the present invention to provide a radiator for electronic parts enabled to prevent air bubbles from being generated in a heat conductive semifluid material, which is caused by such the "pump out" problem, as well as an electronic device including such the radiator for electronic parts, an electric circuit device including such the electronic device, and a computer including such the electronic circuit device.

SUMMARY OF THE INVENTION

A first aspect of the present invention is a radiator for electronic parts, which includes a heat receiving surface for receiving a heat from a heating element, a heat radiating element for radiating a heat transferred from the heat receiving surface, and one or a plurality of through-holes opened to the heat receiving surface at one end and opened to a region other than the heat receiving surface at the other end respectively so that a heat conductive semifluid material being inserted from the one end is driven up and down therein.

The through-hole in the first aspect of the present invention is not limited only to those extended straight. For example, in case the radiator for electronic parts has a column member and the through-hole is formed at the column member, the through-hole may be extended in the direction of the center line of the column member from one end and bent towards the periphery of the column member at a middle point so that the other end is opened to the periphery of the column member. The number of through-holes and the diameter of each through-hole are set to a value that can assure the tip of the heat conductive semifluid material to be stayed in the through-hole regardless of the increase/decrease of the size of the space between the electronic part and the radiator for electronic parts in the electronic device including the radiator for electronic parts. In a typical example, the radiator for electronic parts is made of metal, for example, aluminum, and the thermal conductivity of the radiator is about 200 times that of the heat conductive semifluid material. A region corresponding to a through-hole in the layer of the heat conductive semifluid material increases the heat resistance of the heat transfer path from the heating element to the radiator. Consequently, the less the number of through-holes is and the smaller the diameter of the through-hole is, more effectively the through-hole can suppress the increase of the heat resistance. The radiator for electronic parts is, for example, a heat sink. The heat conductive semifluid material is, for example, thermal grease.

In case there is no through-hole, the heat conductive semifluid material is expanded/shrunk towards/from the periphery according to changes of the layer thickness. The present invention forms one or a plurality of through-holes, so that the amount of the heat conductive semifluid material to be inserted into the through-holes is changed according to changes of the layer thickness, thereby the material is suppressed from expansion/shrinkage towards/from the periphery. Consequently, invasion of air bubbles into the heat conductive semifluid material can be prevented even when the material is expanded/shrunk in the radiation direction.

The conventional radiator for electronic parts might generate air bubbles in the layer of the heat conductive semifluid material when it is manufactured. However, such the generation of air bubbles in the manufacturing process can be prevented by selecting a proper amount of the heat conductive semifluid material to be filled between the heat receiving surface of the radiator for electronic parts and the heating element. At this time, the amount is decided with reference to the timing at which the heat conductive semifluid material goes up in the through-holes of the radiator.

A second aspect of the present invention is a radiator for electronic parts obtained by adding the following to the radiator of the first aspect of the present invention: a plate member having a heat receiving surface at one side, and through-hole(s) extended almost straight in the thickness direction of the plate member.

In the second aspect of the present invention, the radiator may have a plurality of fins for radiation on the surface of the plate member, which is opposite to the heat receiving surface. It may also be configured only by the plate member. In the second aspect of the present invention, the through-hole may be made straight simply in the plate member, so that the structure of the through-hole can be simplified.

A third aspect of the invention is a radiator for electronic parts obtained by forming only one through-hole almost in the center of the heat receiving surface of the radiator of the first aspect of the present invention.

Generally, the thermal conductivity of the heat conductive semifluid material is lower than that of the radiator. In the portion corresponding to each through-hole in the layer of the heat conductive semifluid material, the heat resistance increases between the heating element and the radiator (however, the increase of the heat resistance caused by the formed through-hole is far smaller than the increase of the heat resistance caused by a generated air bubble). Consequently, the less the number of through-holes is and the smaller the diameter of the through-hole is, the more the situation becomes favorable. In case the heat receiving surface is comparatively small, only a small area of the through-hole is required to suppress the amount of the heat conductive semifluid material to be formed out towards the periphery. In case the received heat is distributed almost in uniform all over the heat receiving surface, it is required to form only one through-hole formed almost in the center in the heat receiving surface. And, in case there is only one through-hole such way, it is possible to suppress an increase of the heat resistance caused by the formed through-hole in the layer of the heat conductive semifluid material.

A fourth aspect of the present invention is a radiator for electronic parts, which is obtained by forming a plurality of through-holes so as to be distributed in the heat receiving surface of the radiator for electronic parts of the first aspect of the present invention.

In case there is only one through-hole formed almost in the center of a comparatively large heat receiving surface, it increases the diameter or length of the through-hole required to suppress extrusion of the heat conductive semifluid material towards the periphery. In case the through-hole cannot be extended so long, the diameter of the through-hole increases. At this time, however, such the increase of the through-hole in diameter makes the heat resistance increase at the portion corresponding to each through-hole in the layer of the heat conductive semifluid material. In case the diameter of the through-hole is increased while there is only one through-hole, the temperature is increased remarkably at the portion corresponding to each through-hole in the layer of the heat conductive semifluid material. According to the fourth aspect of the present invention, because a plurality of through-holes are formed so as to be scattered instead of the one large through-hole, thereby the diameter of each of the through-holes is kept small while temperature rises are suppressed at the portion corresponding to each through-hole in the layer of the heat conductive semifluid material.

A fifth aspect of the present invention is an electronic device that includes the following: the radiator for electronic parts according to the first or second aspect of the present invention, an electronic part, which is a heating element; and a heat conductive semifluid material provided between a predetermined surface of the electronic part and the heat receiving surface of the radiator for electronic parts.

According to the fifth aspect of the present invention, the heat of the electronic part is transferred to the heat receiving surface of the radiator for electronic parts via the heat conductive semifluid material, then radiated from the radiating element of the radiator. In case the distance between both surfaces of the layer of the heat conductive semifluid material is short, the semifluid material goes up in the through-hole of the radiator. In case the distance is long, the semifluid material goes down in the through-hole. Consequently, the expansion/shrinkage of the side surfaces of the layer of the semifluid material is suppressed, thereby an air bubble is catched in the semifluid material. The heat resistance of the layer of the semifluid material is thus prevented from increasing.

A sixth aspect of the present invention is an electronic device obtained by replacing the electronic part in the electronic device of the fifth aspect of the present invention with an LSI. According to the sixth aspect of the present invention, the LSI includes, for example, a CPU (Central Processing Unit), a memory controller, a video controller, etc.

The electric circuit device of a seventh aspect of the present invention includes the electronic device according to the fifth aspect of the present invention, and a wired board on which the electronic device is mounted. This electric circuit device is, for example, a mother board of a computer.

The radiator for electronic parts is fixed to the wired board by bolts, etc. The thermal expansibility of the radiator differs from that of the wired board. Consequently, according to a temperature change of the electric circuit device, the wired board changes the bending degree of the radiator, thereby the size of the space between the electronic part and the radiator is increased/decreased. In case there is no through-hole in the radiator and the size of the space between the electronic part and the radiator is increased/decreased, the side surfaces of the layer of the heat conductive semifluid material are expanded/shrunk. Thus, air bubbles enter the semifluid material to increase the heat resistance of the layer of the semifluid material sometimes. Because one or a plurality of through-holes are formed in the radiator so as to increase/decrease the space between the electronic part and the radiator, thereby the heat conductive semifluid material goes up and down in those through-holes, the seventh aspect of the present invention can suppress expansion/shrinkage of the side surfaces of the layer of the heat conductive semifluid material and prevent air bubbles from being caught in the heat conductive semifluid material.

An eighth aspect of the present invention is a computer, which includes the electric circuit device according to the seventh aspect of the present invention. The electronic part employed in the eighth aspect of the present invention is a CPU. The computer may be, for example, a lap-top or a desk-top personal computer.

A ninth aspect of the present invention is an electronic device, which includes the following: the radiator for electronic parts according to the third or fourth aspect of the present invention; an electronic part, which is a heating element; and a heat conductive semifluid material provided between a predetermined surface of the electronic part and the heat receiving surface of the radiator.

A tenth aspect of the present invention is an electronic device in which the electronic part employed in the electronic device according to the ninth aspect of the present invention is replaced with an LSI.

An eleventh aspect of the present invention is an electric circuit device, which includes the electronic device according to the ninth aspect of the present invention, and a wired board on which the electronic device is mounted.

A twelfth aspect of the present invention is a computer including the electric circuit device wherein the employed electronic part is a CPU.

DESCRIPTION OF THE ILLUSTRATIVE EMBODIMENTS

Hereinafter, a preferred embodiment of the present invention will be described with reference to the accompanying drawings.

Figure 1:
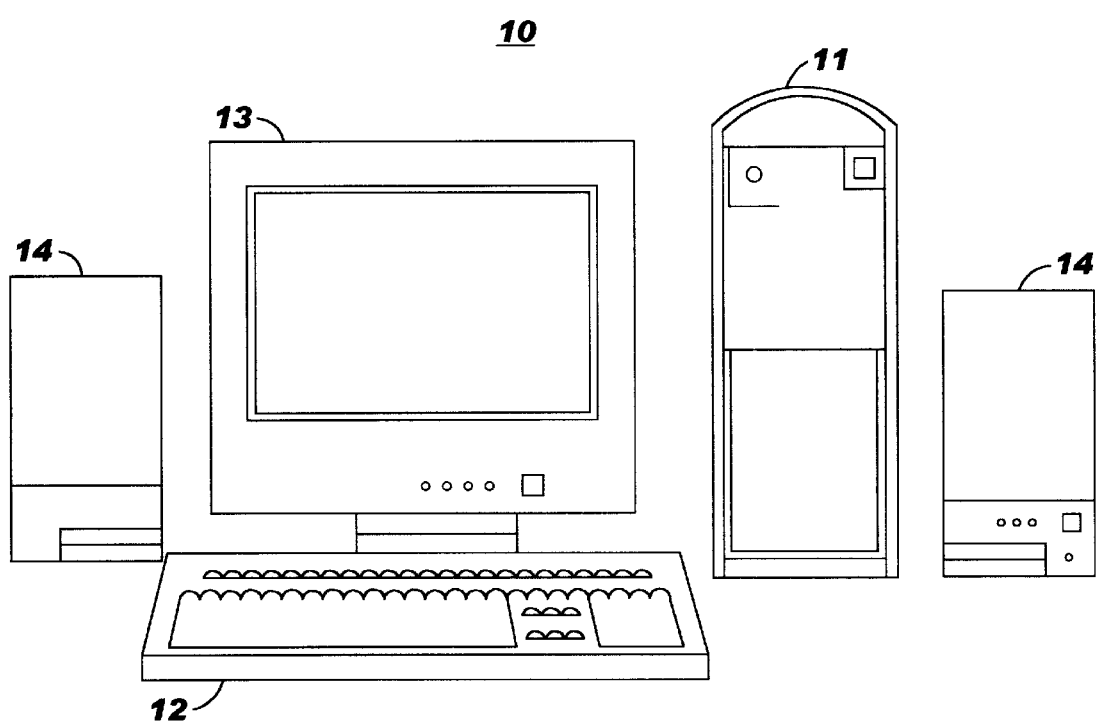
FIG. 1 is a front view of a desk top computer.
Figure 2:
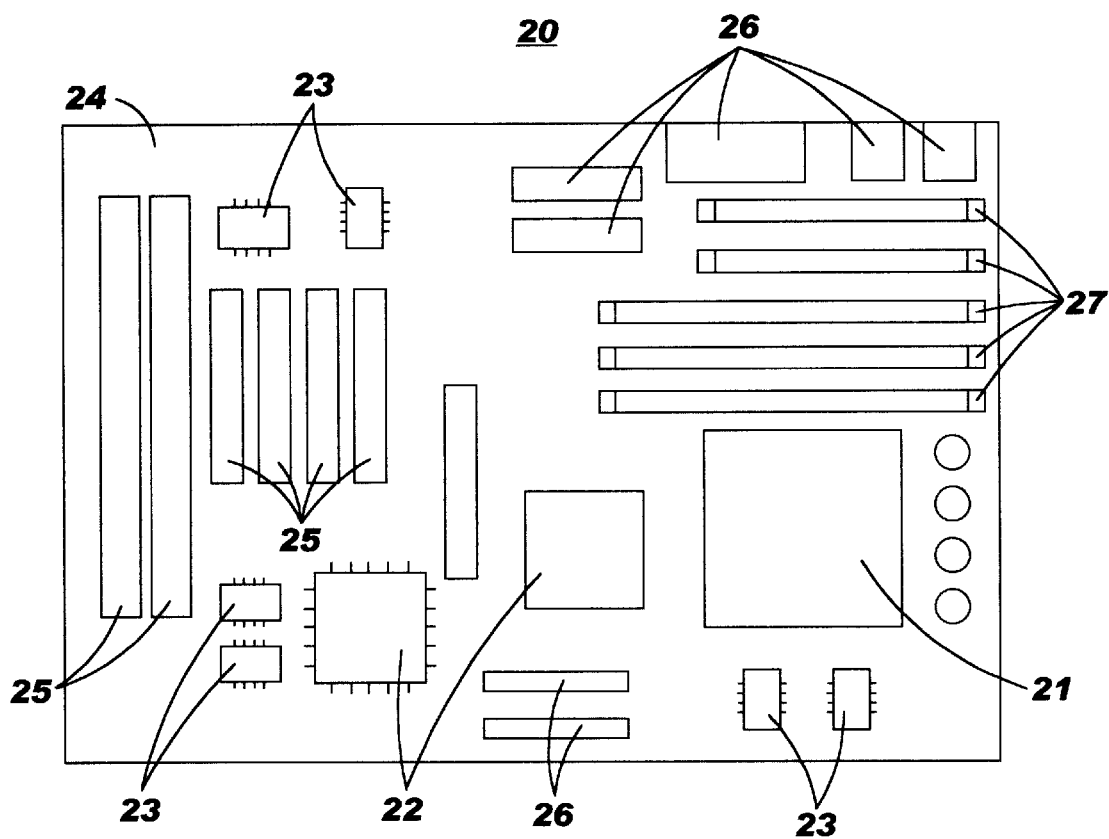
FIG. 2 is a schematic view of a mother board mounted in the body of the desk top computer shown in FIG. 1.

FIG. 1 shows a front view of a desk top computer 10. The desk top computer 10 includes a computer body 11, a keyboard 12, a display 13, and right and left speakers 14. FIG. 2 is a schematic view of a mother board 20 mounted in the computer body 11 of the desk top computer 10. The mother board 20 includes a wired board body 24 on which are mounted a CPU package 21, as well as such ICs as a chip 22, an IC 23, etc., and such slots 25 as ISA and PCI, such connectors 26 as serial and parallel connectors, as well as keyboard and mouse connectors, and further a memory socket 27, etc.

Figure 3:
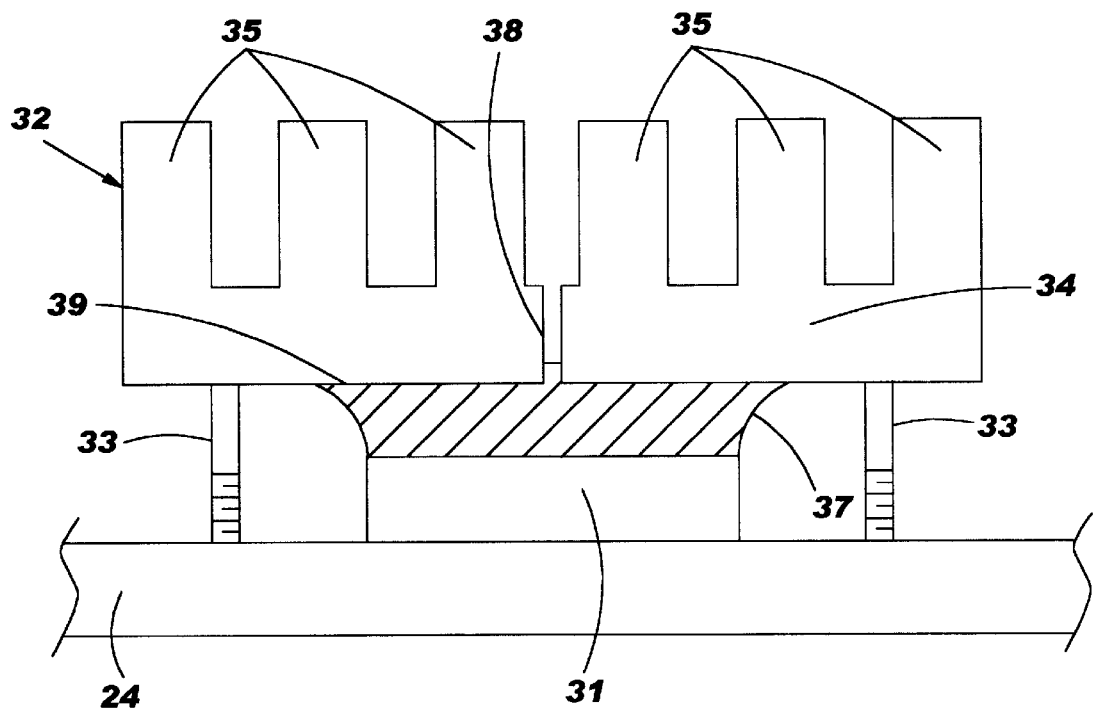
FIG. 3 is a configuration of a CPU package.

FIG. 3 shows a configuration of the CPU package 21. The CPU chip 31 is mounted on the wired board body 24. A heat sink 32 is disposed above the CPU chip 31 and fixed to the wired board body 24 with a plurality bolts 33 at its predetermined peripheral points.

The heat sink 32 is spread in parallel to the top surface of the CPU chip 31. The heat sink 32 includes a plate member 34 that covers the top surface of the CPU 31 and a plurality of fins 35 disposed in parallel to each other at equal pitches and erected from the plate member 34 on the top surface of the plate member 34. The bottom surface of the plate member 34 comes in contact with the top surface of the CPU chip 31. However, because the CPU chip 31 is not so strong in structure, the plate member 34 cannot be pressed so strongly against the top surface of the CPU chip 31. And, because of the unevenness of both the top surface of the CPU chip 31 and the bottom surface of the plate member 34, the actual direct contact area between the top surface of the CPU chip 31 and the bottom surface of the plate member 34 is small. Concretely, some air is left between the top surface of the CPU chip 31 and the bottom surface of the plate member 34 and the residual air causes the heat resistance of both items to be increased. This is why the thermal grease 37 is filled between the top surface of the CPU chip 31 and the bottom surface of the plate member 34 so as to purge the air from between the top surface of the CPU chip 31 and the bottom surface of the plate member 34 and solve this problem. The thermal grease may be, for example, Silicon Grease G765 (Shin-Etsu Chemical Co., Ltd.). The bottom surface of the plate member 34, on which the thermal grease 37 is stuck, functions as a heat receiving surface 39. A through-hole 38 is located in the center of the thermal grease 37 so as to go straight through the plate member 34 in the vertical direction. The lower end of the through-hole 38 is opened to the thermal grease 37 and the upper end thereof is opened to the top surface of the plate member 34.

Figure 4A:
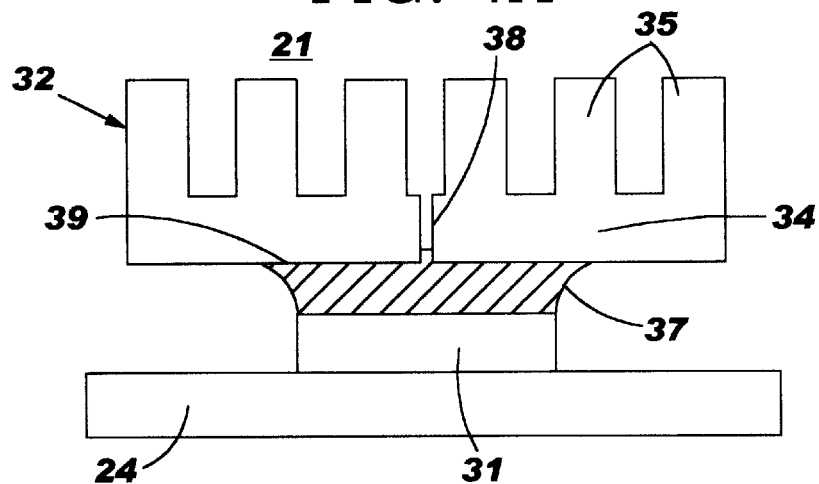
FIGS. 4(A), 4(B) and 4(C) show how the state of thermal grease is changed in the CPU package in a bending process of a wired board.
Figure 4B:
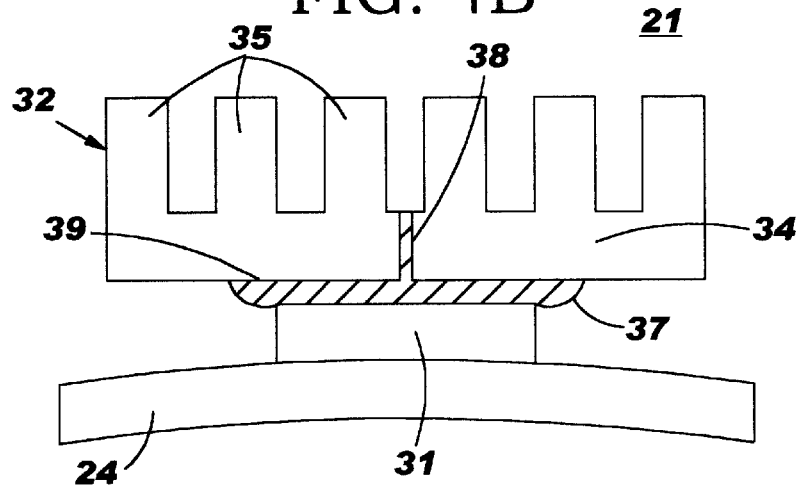
Figure 4C:
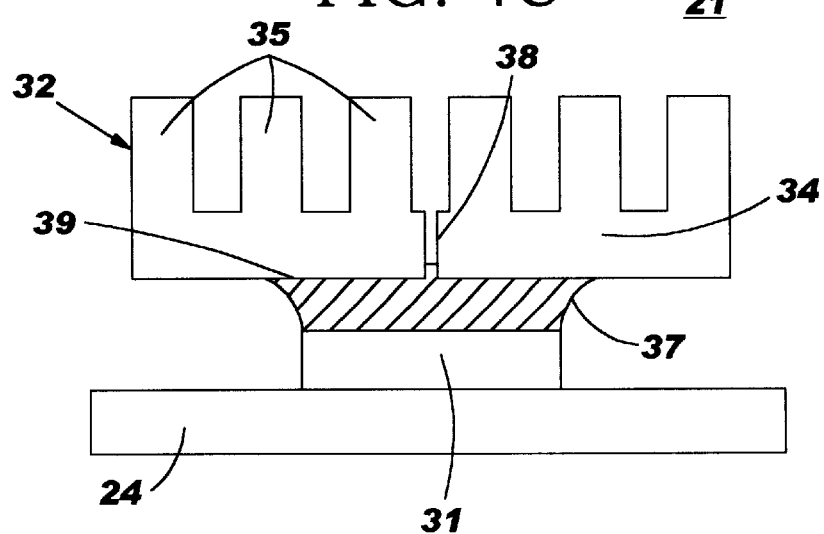

FIG. 4(A), FIG. 4(B) and FIG. 4(C) collectively show how the state of the thermal grease 37 of the CPU package 21 is changed in a bending process of the wired board body 24. At first, the CPU package 21 is under the first temperature T1 in FIG. 4(A), then goes under the second temperature T2 (that is different from T1) in FIG. 4(B) and then returns under the first temperature T1 in FIG. 4(C). In FIG. 4(B), the wired board body 24 is bent (convex) towards the heat sink 32 and the space between the top surface of the CPU chip 31 and the bottom surface of the plate member 34 (hereinafter, this space will be referred to as the "space A" as needed) is shrunk especially around the thermal grease 37 in the center of the heat receiving surface 39. Due to this shrinkage, the thermal grease 37 extruded from the shrunk part is suppressed from going towards the periphery of the thermal grease 37 and led into, then up in the through-hole 38. In FIG. 4(C), the bending of the wired board body 24 towards the heat sink 32 is eliminated, thereby the space A restores its original standard size. Due to this restoration, the thermal grease 37 in the through-hole 38 goes down so as to be supplied smoothly to the expanded part of the space A. Consequently, the side surface of the thermal grease 37 is suppressed from expansion/shrinkage, thereby catching of air bubbles in the thermal grease 37 is prevented.

Figure 5:
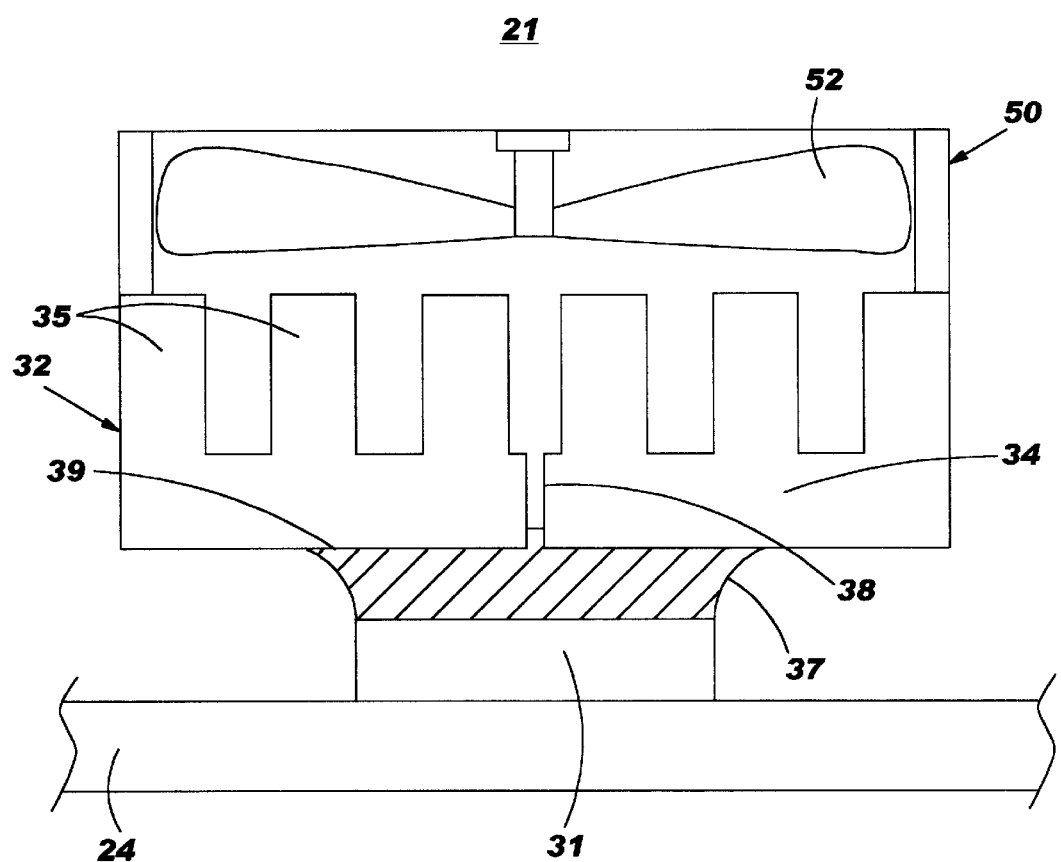
FIG. 5 is a front view of the CPU package provided with a cooling fan unit.

FIG. 5 shows a front view of the CPU package 21 to which a cooling fan unit 50 is added. The cooling fan unit 50 has a fan 52 and it is fixed to the upper portion of the heat sink 32. The rotation of the fan 52 makes the air flow forcibly into the spaces among the fins 35 of the heat sink 32, thereby the cooling effect of the CPU chip 31 is more improved.

Figure 6:
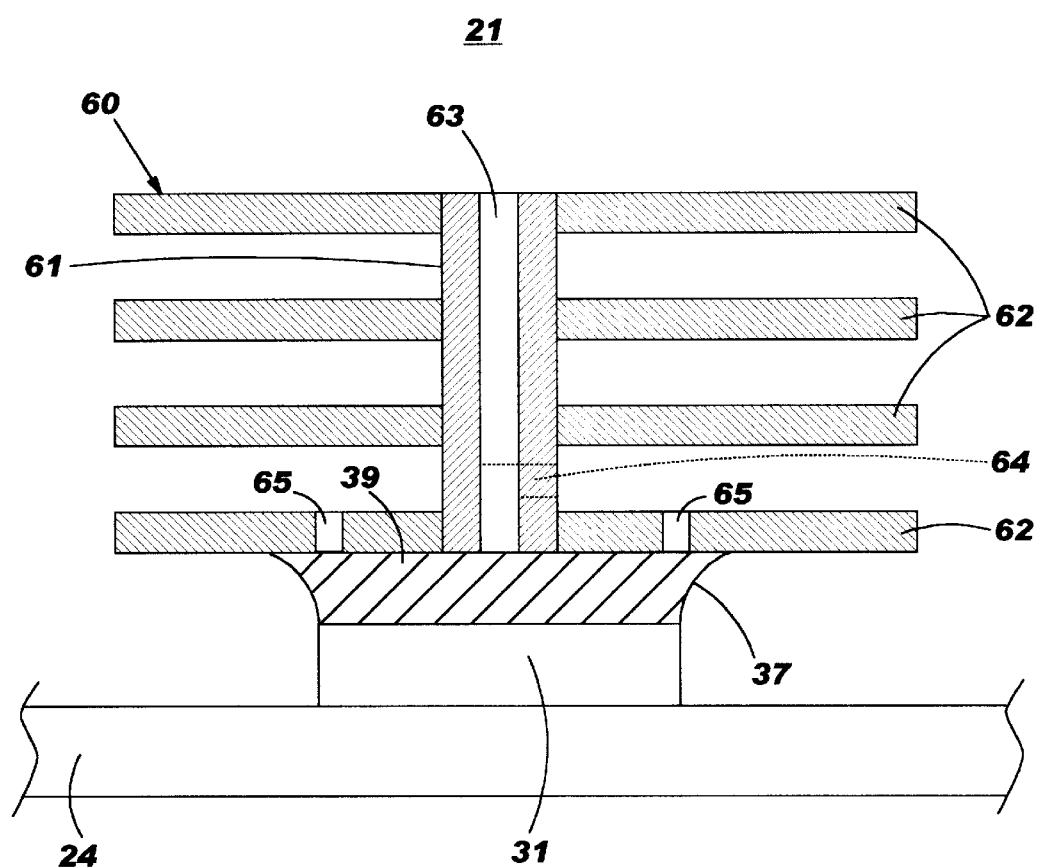
FIG. 6 is a front view of the CPU package provided with another heat sink.
Figure 7A:
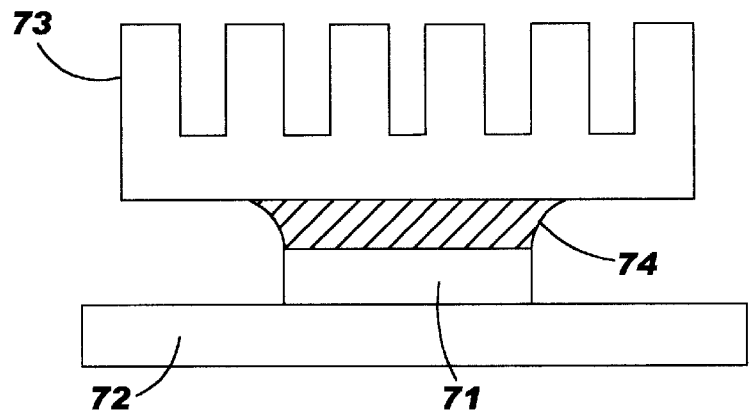
FIGS. 7(A), 7(B) and 7(C) show how an air bubble is generated in the thermal grease in a bending process of the wired board employed in the conventional electronic device.
Figure 7B:
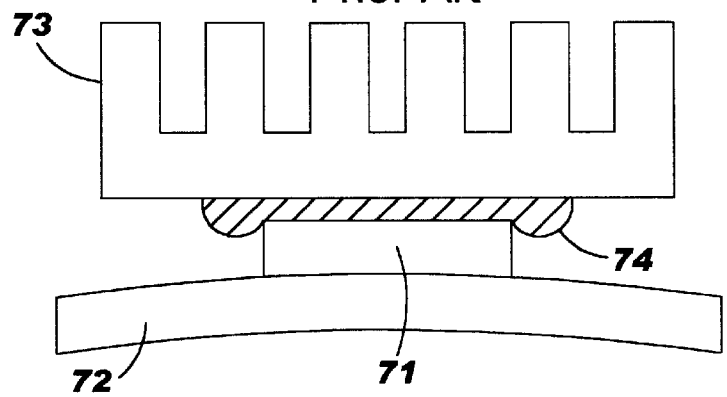
Figure 7C:
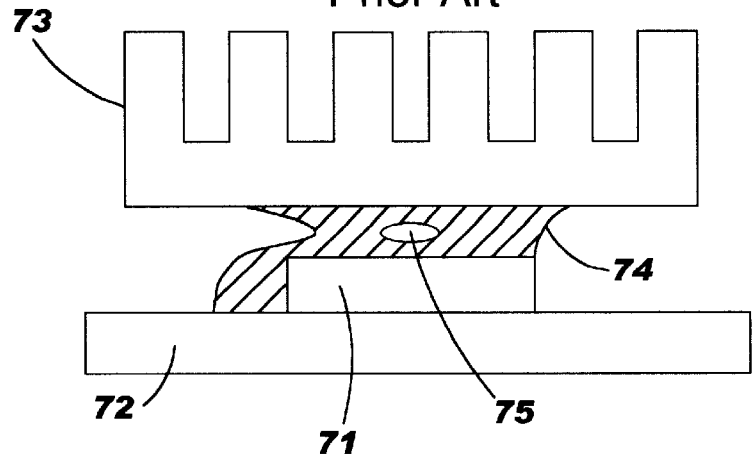

FIG. 6 is a front view of the CPU package 21 provided with another heat sink 60. The heat sink 60 includes a column member 61 extended vertically at a predetermined diameter; a plurality of fins 62 fixed to the column member 61 and spread in the horizontal direction from the column member 61 at equal intervals. The lowermost fins 62 are located face to face with the top surface of the CPU chip 31. The vertical through-hole 63 is extended along the center line of the column member 61 so as to go through the column member 61. Instead of the vertical through-hole 63 going through the column member 61, a bent through-hole 64 may be formed so as to be bent at right angles at a middle point of the column member 61 and opened to the periphery of the column member 61. And, instead of the column member 61, one or a plurality of through-holes 65 may be formed at the lowest fins 62.

Although the present invention and its advantages have been described in detail, it should be understood that various changes, substitutions and alterations can be made herein without departing from the spirit and scope of the invention as defined by the appended claims.

What is claimed:

1. An electronic device, comprising:
   a heat generating element;
   a radiator having a heat receiving surface for receiving heat from said heating generating element, a radiating element for radiating heat transferred from said heat receiving surface, and a first through-hole opened at one end to said heat receiving surface and opened at an opposite end; and
   a heat conductive semifluid material being positioned between the heat generating element and said heat receiving surface, wherein said heat conductive semifluid material is driven up and down in said first through-hole in response to changes in temperature.

2. The electronic device of claim 1, wherein said radiator further comprises:
   a plate member having said heat receiving surface; and
   a second through-hole extended through said plate member in a direction substantially perpendicular to said heat receiving surface; wherein, said heat conductive semifluid material is being driven up and down in said second through-hole in response to changes in temperature.

* * * * *